(12) United States Patent
Zhang et al.

(10) Patent No.: US 10,692,434 B2
(45) Date of Patent: Jun. 23, 2020

(54) PIXEL CIRCUIT, DISPLAY PANEL, DISPLAY DEVICE AND DRIVING METHOD

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Yi Zhang, Beijing (CN); Kai Zhang, Beijing (CN); Minghua Xuan, Beijing (CN); Young Yik Ko, Beijing (CN); Lujiang Huangfu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 0 days.

(21) Appl. No.: 15/569,243

(22) PCT Filed: Apr. 7, 2017

(86) PCT No.: PCT/CN2017/079713
§ 371 (c)(1),
(2) Date: Oct. 25, 2017

(87) PCT Pub. No.: WO2018/036169
PCT Pub. Date: Mar. 1, 2018

(65) Prior Publication Data
US 2018/0315374 A1    Nov. 1, 2018

(30) Foreign Application Priority Data
Aug. 22, 2016 (CN) .......................... 2016 1 0703367

(51) Int. Cl.
G09G 3/3258 (2016.01)
G09G 3/3208 (2016.01)
G09G 3/3233 (2016.01)

(52) U.S. Cl.
CPC ......... *G09G 3/3258* (2013.01); *G09G 3/3208* (2013.01); *G09G 3/3233* (2013.01);
(Continued)

(58) Field of Classification Search
None
See application file for complete search history.

(56) References Cited

U.S. PATENT DOCUMENTS 8,537,077 B2   9/2013  Lee et al.
2006/0176251 A1   8/2006  Park et al.
(Continued)

FOREIGN PATENT DOCUMENTS

CN   1819000 A   8/2006
CN   1963905 A   5/2007
(Continued)

OTHER PUBLICATIONS

International Search Report and Written Opinion dated Jun. 28, 2017; PCT/CN2017/079713.
(Continued)

*Primary Examiner* — Nicholas J Lee

(57) ABSTRACT

A pixel circuit, a display panel, a display device and a driving method. The pixel circuit includes a storage capacitor, an organic light emitting diode, a driving transistor, an emission control circuit, a reset circuit, a threshold compensation circuit, a first data write circuit, a reference voltage write circuit, and an initializing circuit.

20 Claims, 5 Drawing Sheets

(52) U.S. Cl.
CPC ............... *G09G 2300/0819* (2013.01); *G09G 2300/0861* (2013.01); *G09G 2310/0251* (2013.01); *G09G 2310/0262* (2013.01); *G09G 2320/0204* (2013.01); *G09G 2320/045* (2013.01); *G09G 2320/0693* (2013.01)

(56) References Cited

U.S. PATENT DOCUMENTS

| | | |
|---|---|---|
| 2007/0124633 A1 | 5/2007 | Kim |
| 2008/0150847 A1 | 6/2008 | Kim et al. |
| 2009/0167648 A1 | 7/2009 | Jeon et al. |
| 2009/0174699 A1 | 7/2009 | Fish et al. |
| 2009/0237123 A1 | 9/2009 | Jinta |
| 2011/0102403 A1 | 5/2011 | Kim |
| 2011/0193855 A1 | 8/2011 | Han |
| 2011/0279484 A1* | 11/2011 | Han ..................... G09G 3/3233 345/690 |
| 2014/0139503 A1 | 5/2014 | Han |
| 2015/0009199 A1 | 1/2015 | In et al. |
| 2016/0012800 A1 | 1/2016 | Han et al. |
| 2016/0035276 A1 | 2/2016 | Yin et al. |
| 2016/0042691 A1* | 2/2016 | Na ..................... G09G 3/3266 345/205 |
| 2016/0155379 A1 | 6/2016 | Na |
| 2017/0153759 A1 | 6/2017 | Ding et al. |

FOREIGN PATENT DOCUMENTS

| | | |
|---|---|---|
| CN | 100429689 C | 10/2008 |
| CN | 101471032 A | 7/2009 |
| CN | 101540139 A | 9/2009 |
| CN | 103700342 A | 4/2014 |
| CN | 203882587 U | 10/2014 |
| CN | 203882588 U | 10/2014 |
| CN | 204029330 U | 12/2014 |
| CN | 104835454 A | 8/2015 |
| CN | 105243985 A | 1/2016 |
| CN | 106097964 A | 11/2016 |
| CN | 205920745 U | 2/2017 |

OTHER PUBLICATIONS

The First Chinese Office Action dated Mar. 9, 2018; Appln. No. 201610703367.9.

* cited by examiner

PIXEL CIRCUIT, DISPLAY PANEL, DISPLAY DEVICE AND DRIVING METHOD

TECHNICAL FIELD

Embodiments of the present disclosure relate to a pixel circuit, a display panel, a display device and a driving method.

BACKGROUND

In the display field, organic light-emitting diode (OLED) display panels have the characteristics of autoluminescence, high contrast, low power consumption, wide viewing angle, rapid response speed, capability of being applied in flexible panels, wide service temperature range, simple production, etc., and have a wide development prospect.

Due to the above characteristics, OLED display panels may be applicable to devices with display function such as mobile phones, displays, notebook computers, digital cameras, and instruments and meters.

SUMMARY

An embodiment of the present disclosure provides a pixel circuit, comprising: a storage capacitor including a first end connected with a first node and a second end connected with a second node; an organic light-emitting diode (OLED) including a first electrode connected with a third node; a driving transistor including a gate electrode connected with the first node, wherein the driving transistor is configured to control the OLED to emit light according to a voltage of the first node; an emission control circuit configured to receive an emission control signal and control an on/off state of the OLED according to the emission control signal; a reset circuit configured to receive a reset control signal and write a reset voltage into the first node according to the reset control signal; a threshold compensation circuit configured to receive a first scanning signal and write a compensating voltage into the first node according to the first scanning signal, wherein the compensating voltage is a sum of a first supply voltage and a threshold voltage of the driving transistor; a first data write circuit configured to receive the first scanning signal and a data signal and write the data signal into the second node according to the first scanning signal; a reference voltage write circuit configured to receive a second scanning signal and write a reference voltage into the second node according to the second scanning signal; and an initializing circuit configured to receive the first scanning signal or the reset control signal and write an initializing voltage into the third node according to the first scanning signal or the reset control signal.

For example, in the pixel circuit according to an embodiment of the present disclosure, the initializing voltage is equal to the reset voltage.

For example, in the pixel circuit according to an embodiment of the present disclosure, the OLED further includes a second electrode; the second electrode of the OLED is electrically connected with a second power line to receive a second supply voltage; the first electrode of the OLED is an anode; the second electrode of the OLED is a cathode; and difference between the initializing voltage and the second supply voltage is less than a cut-in voltage of the OLED.

For example, in the pixel circuit according to an embodiment of the present disclosure, the initializing voltage is less than the second supply voltage.

For example, in the pixel circuit according to an embodiment of the present disclosure, the reset circuit includes a first transistor; the threshold compensation circuit includes a second transistor; the first data write circuit includes a third transistor; the reference voltage write circuit includes a fourth transistor; the emission control circuit includes a fifth transistor; and the initializing circuit includes a sixth transistor.

For example, in the pixel circuit according to an embodiment of the present disclosure, a gate electrode of the driving transistor is electrically connected with the first node; a first electrode of the driving transistor is electrically connected with a first power line to receive the first supply voltage; and a second electrode of the driving transistor is electrically connected with a fourth node; the first electrode of the OLED is electrically connected with the third node, and a second electrode of the OLED is electrically connected with a second power line to receive a second supply voltage; the first end of the storage capacitor is electrically connected with the first node, and the second end of the storage capacitor is electrically connected with the second node; a gate electrode of the first transistor is electrically connected with a reset control signal line to receive the reset control signal; a first electrode of the first transistor is electrically connected with a reset voltage line to receive the reset voltage; and a second electrode of the first transistor is electrically connected with the first node; a gate electrode of the second transistor is electrically connected with a first scanning signal line to receive the first scanning signal; a first electrode of the second transistor is electrically connected with the first node; and a second electrode of the second transistor is electrically connected with the fourth node; a gate electrode of the third transistor is electrically connected with the first scanning signal line to receive the first scanning signal; a first electrode of the third transistor is electrically connected with a data signal line to receive the data signal; and a second electrode of the third transistor is electrically connected with the second node; a gate electrode of the fourth transistor is electrically connected with a second scanning signal line to receive a second scanning signal; a first electrode of the fourth transistor is electrically connected with a reference voltage line to receive the reference voltage; and a second electrode of the fourth transistor is electrically connected with the second node; a gate electrode of the fifth transistor is electrically connected with an emission control signal line to receive the emission control signal; a first electrode of the fifth transistor is electrically connected with the third node; and a second electrode of the fifth transistor is electrically connected with the fourth node; and a gate electrode of the sixth transistor is electrically connected with the first scanning signal line or the reset control signal line to receive the first scanning signal or the reset control signal; a first electrode of the sixth transistor is electrically connected with the reset voltage line to receive the reset voltage; and a second electrode of the sixth transistor is electrically connected with the third node.

For example, in the pixel circuit according to an embodiment of the present disclosure, the driving transistor, the first transistor, the second transistor, the third transistor, the fourth transistor, the fifth transistor and the sixth transistor are all P-type transistors.

For example, in the pixel circuit according to an embodiment of the present disclosure, the driving transistor, the first transistor, the second transistor, the third transistor, the fourth transistor, the fifth transistor and the sixth transistor are all thin-film transistors (TFTs).

For example, the pixel circuit according to an embodiment of the present disclosure further comprises a second data write circuit configured to receive the reset control signal and the data signal and write the data signal into the second node according to the reset control signal.

For example, in the pixel circuit according to an embodiment of the present disclosure, the reset circuit includes a first transistor; the threshold compensation circuit includes a second transistor; the first data write circuit includes a third transistor; the reference voltage write circuit includes a fourth transistor; the emission control circuit includes a fifth transistor; the initializing circuit includes a sixth transistor; and the second data write circuit includes a seventh transistor.

For example, in the pixel circuit according to an embodiment of the present disclosure, a gate electrode of the driving transistor is electrically connected with the first node; a first electrode of the driving transistor is electrically connected with a first power line to receive the first supply voltage; and a second electrode of the driving transistor is electrically connected with a fourth node; the first electrode of the OLED is electrically connected with the third node, and a second electrode of the OLED is electrically connected with a second power line to receive a second supply voltage; the first end of the storage capacitor is electrically connected with the first node, and the second end of the storage capacitor is electrically connected with the second node; a gate electrode of the first transistor is electrically connected with a reset control signal line to receive the reset control signal; a first electrode of the first transistor is electrically connected with a reset voltage line to receive the reset voltage; and a second electrode of the first transistor is electrically connected with the first node; a gate electrode of the second transistor is electrically connected with a first scanning signal line to receive the first scanning signal; a first electrode of the second transistor is electrically connected with the first node; and a second electrode of the second transistor is electrically connected with the third node; a gate electrode of the third transistor is electrically connected with the first scanning signal line to receive the first scanning signal; a first electrode of the third transistor is electrically connected with a data signal line to receive the data signal; and a second electrode of the third transistor is electrically connected with the second node; a gate electrode of the fourth transistor is electrically connected with a second scanning signal line to receive the second scanning signal; a first electrode of the fourth transistor is electrically connected with a reference voltage line to receive the reference voltage; and a second electrode of the fourth transistor is electrically connected with the second node; a gate electrode of the fifth transistor is electrically connected with a emission control signal line to receive the emission control signal; a first electrode of the fifth transistor is electrically connected with the third node; and a second electrode of the fifth transistor is electrically connected with the fourth node; a gate electrode of the sixth transistor is electrically connected with the first scanning signal line or the reset control signal line to receive the first scanning signal or the reset control signal; a first electrode of the sixth transistor is electrically connected with the reset voltage line to receive the reset voltage; and a second electrode of the sixth transistor is electrically connected with the third node; and a gate electrode of the seventh transistor is electrically connected with the reset control signal line to receive the reset control signal; a first electrode of the seventh transistor is electrically connected with the data signal line to receive the data signal; and a second electrode of the seventh transistor is electrically connected with the second node.

For example, in the pixel circuit according to an embodiment of the present disclosure, the driving transistor, the first transistor, the second transistor, the third transistor, the fourth transistor, the fifth transistor, the sixth transistor and the seventh transistor are all P-type transistors.

For example, in the pixel circuit according to an embodiment of the present disclosure, the driving transistor, the first transistor, the second transistor, the third transistor, the fourth transistor, the fifth transistor, the sixth transistor and the seventh transistor are all TFTs.

An embodiment of the present disclosure provides a display panel comprises the pixel circuit according to an embodiment of the present disclosure.

For example, the display panel according to an embodiment of the present disclosure further comprises: a data driver configured to provide the data signal for the pixel circuit; and a scan driver configured to provide the emission control signal, the first scanning signal, the second scanning signal and the reset control signal for the pixel circuit.

An embodiment of the present disclosure provides a display device, comprising the display panel according to an embodiment of the present disclosure.

An embodiment of the present disclosure provides a driving method of the pixel circuit according to an embodiment of the present disclosure, comprising a reset period, a data write and threshold compensation period, a voltage drop compensation period, and an emission period within the display period of one frame, wherein in the reset period, the emission control signal is set to be a turn-off voltage; the reset control signal is set to be a turn-on voltage; the first scanning signal is set to be a turn-off voltage; the second scanning signal is set to be a turn-on voltage; the data signal is set to be an ineffective data signal; in the data write and threshold compensation period, the emission control signal is set to be a turn-off voltage; the reset control signal is set to be a turn-off voltage; the first scanning signal is set to be a turn-on voltage; the second scanning signal is set to be a turn-off voltage; the data signal is set to be an effective data signal; in the voltage drop compensation period, the emission control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal; and in the emission period, the emission control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal.

An embodiment of the present disclosure provides a driving method of the pixel circuit according to an embodiment of the present disclosure, comprising a reset period, a data write and threshold compensation period, a voltage drop compensation period and an emission period within the display period of one frame, wherein in the reset period, the emission control signal is set to be a turn-off voltage; the reset control signal is set to be a turn-on voltage; the first scanning signal is set to be a turn-off voltage; the second scanning signal is set to be a turn-off voltage; the data signal is set to be an effective data signal; in the data write and threshold compensation period, the emission control signal is set to be a turn-off voltage; the reset control signal is set to be a turn-off voltage; the first scanning signal is set to be a turn-on voltage; the second scanning signal is set to be a turn-off voltage; the data signal is set to be an effective data signal; in the voltage drop compensation period, the emission control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal; in the emission period, the emission control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal.

For example, in the driving method according to an embodiment of the present disclosure, a ratio of a duration of the emission period in the display period of one frame is adjustable.

For example, the driving method according to an embodiment of the present disclosure further comprises an emission continuation period within the display period of one frame, wherein the emission continuation period includes at least one shutdown sub-period and at least one emission sub-period; in the shutdown sub-period, the emission control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal; in the emission sub-period, the emission control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal.

For example, in the driving method according to an embodiment of the present disclosure, a ratio of a sum of a duration of the emission period and total duration of the emission sub-period or emission sub-periods to the display period of one frame is adjustable.

For example, in the driving method according to an embodiment of the present disclosure, a duration of each shutdown sub-period is equal to a sum of a duration of the reset period, a duration of the data write and threshold compensation period, and a duration of the voltage drop compensation period; and a duration of each emission sub-period is equal to a duration of the emission period.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
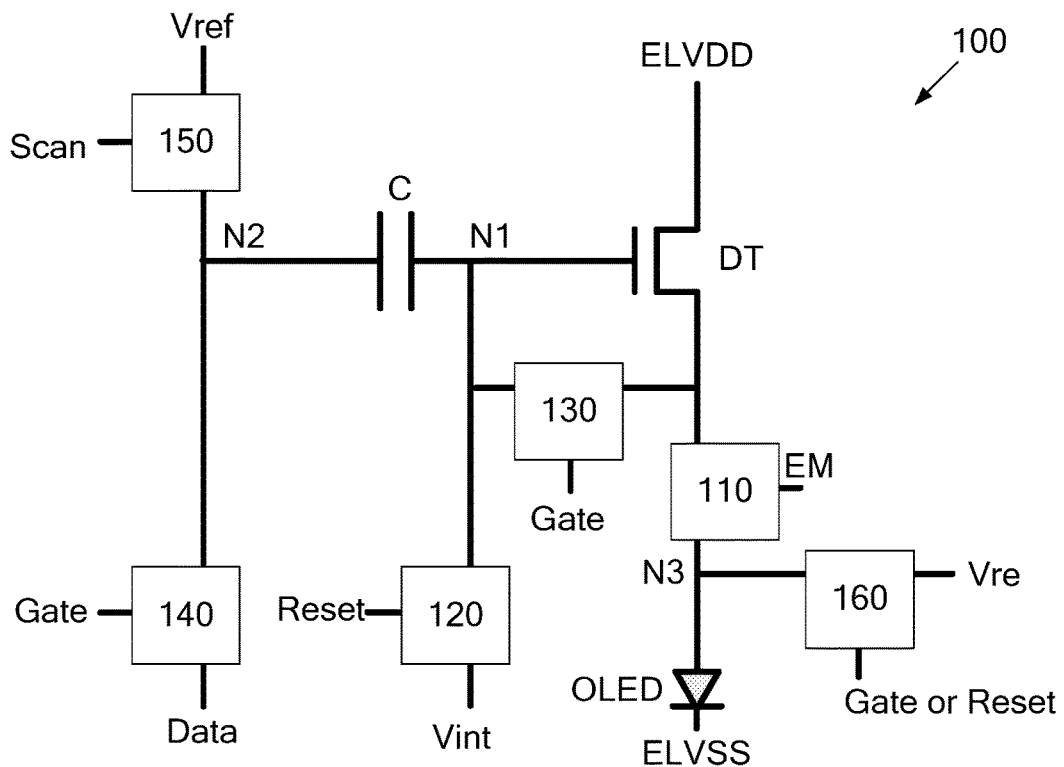
FIG. 1 is a schematic diagram 1 of a pixel circuit provided by the embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. In addition, in the embodiments of the present disclosure, the same or similar reference signs are used to refer to the same or similar components.

The phenomenon of IR drop may occur in an OLED display panel. The IR drop is caused by the resistance voltage division of the leads or wires in the display panel, namely certain voltage drop will be produced over the leads when current runs through the leads in the display panel according to Ohm's law. Thus, the extents to which pixel units at different positions are affected by the IR drop are not the same, and hence nonunifoim display of the display panel can be caused. Therefore, the IR drop in the OLED display panel must be compensated.

Moreover, in an OLED display panel, the threshold voltages of driving transistors in the pixel units may be different due to the manufacturing process. Furthermore, due to the influence of, for instance, temperature variation, the threshold voltages of the driving transistors also suffer from drift phenomenon. Thus, the difference among the threshold voltages of the driving transistors may also result in non-uniform display of the display panel. Therefore, the threshold voltages must also be compensated.

Moreover, an OLED pixel compensating circuit may have leakage currents and may still have the brightness of 0.01-0.03 nits in a black state, so absolute black cannot be obtained, and hence high contrast cannot be achieved.

In addition, the gray scale levels of the OLED display device are controlled by the data voltages of the drive circuit. In the case of displaying at a low gray scale (for instance, when used at night), the drive circuit is difficult to realize accurate control under the condition of outputting a low-grayscale data voltage.

An embodiment of the present disclosure provides a pixel circuit, a display panel, a display device and a driving method, which can realize the IR drop compensation and the threshold voltage compensation of the display panel, improve the uniformity of drive current, improve the display uniformity of the display panel, meanwhile, reduce the leakage current to ensure high contrast in the black state, and ensure accurate display under a low-grayscale condition by adjustment of the ratio of the emission period in the display period of one frame.

An embodiment of the present disclosure provides a pixel circuit 100. As illustrated in FIG. 1, the pixel circuit 100 comprises: a storage capacitor C, an organic light emitting diode (OLED), a driving transistor DT, an emission control circuit 110, a reset circuit 120, a threshold compensation circuit 130, a first data write circuit 140, a reference voltage write circuit 150, and an initializing circuit 160.

For instance, as shown in FIG. 1, the storage capacitor C includes a first end connected with a first node N1 and a second end connected with a second node N2. The OLED includes a first electrode connected with a third node N3. The driving transistor DI includes a gate electrode connected with the first node N1 and is configured to control the OLED to emit light according to the voltage of the first node N1. The emission control circuit 110 is configured to receive an emission control signal EM and control the on/off of the OLED according to the emission control signal EM. The reset circuit 120 is configured to receive a reset control signal Reset and write a reset voltage Vint into the first node N1 according to the reset control signal Reset. The threshold compensation circuit 130 is configured to receive a first scanning signal Gate and write a compensating voltage to the first node N1 according to the first scanning signal Gate, and the compensating voltage is ELVDD+Vth, i.e., the sum of the first supply voltage ELVDD and the threshold voltage Vth of the driving transistor. The first data write circuit 140 is configured to receive the first scanning signal Gate and a data signal Data and write the data signal Data into the second node N2 according to the first scanning signal Gate. The reference voltage write circuit 150 is configured to receive a second scanning signal Scan and write a reference voltage Vref into the second node N2 according to the second scanning signal Scan. The initializing circuit 160 is configured to receive the first scanning signal Gate or the reset control signal Reset, and write initializing voltage Vre into the third node N3 according to the first scanning signal Gate or the reset control signal Reset.

Figure 2:
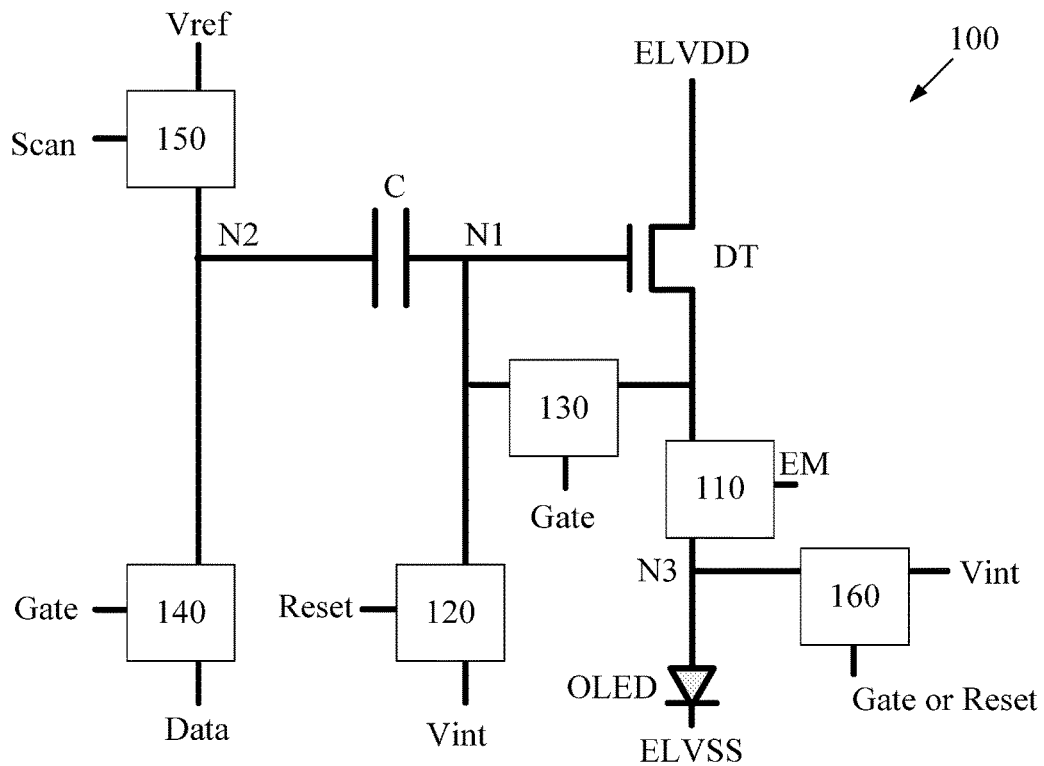
FIG. 2 is a schematic diagram 2 of a pixel circuit provided by the embodiment of the present disclosure.

For instance, as shown in FIG. 2, in the pixel circuit 100 provided by the embodiment of the present disclosure, the initializing voltage Vre is equal to the reset voltage Vint. That is to say, the reset voltage may be simultaneously applied to the reset circuit 120 and the initializing circuit 160. This setting can save a voltage output port, simplify the circuit, and reduce the cost.

For instance, as shown in FIG. 2, in the pixel circuit 100 provided by the embodiment of the present disclosure, the OLED further includes a second electrode; and the second electrode of the OLED is electrically connected with a second power line to receive a second supply voltage ELVSS. For instance, the first electrode of the OLED is an anode, and the second electrode of the OLED is a cathode. The difference between the initializing voltage Vre and the second supply voltage ELVSS is less than the cut-in voltage of the OLED. Thus, the initializing circuit 160 writes the initializing voltage Vre into the third node N3 and may initialize the voltage of the third node N3 (namely the voltage of the anode of the OLED). As the difference between the initializing voltage Vre and the second supply voltage ELVSS is less than the cut-in voltage of the OLED, the abnormal light emission of the OLED after initialization can be avoided, and the display quality can be improved.

For instance, in the pixel circuit 100 provided by the embodiment of the present disclosure, the initializing voltage Vre is less than or equal to the second supply voltage ELVSS. For instance, as the initializing voltage Vre is less than or equal to the second supply voltage ELVSS, the OLED can be in the reverse cut-off state after initialization, so the abnormal light emission of the OLED after initialization can be avoided, and hence the display quality can be improved.

Figure 3:
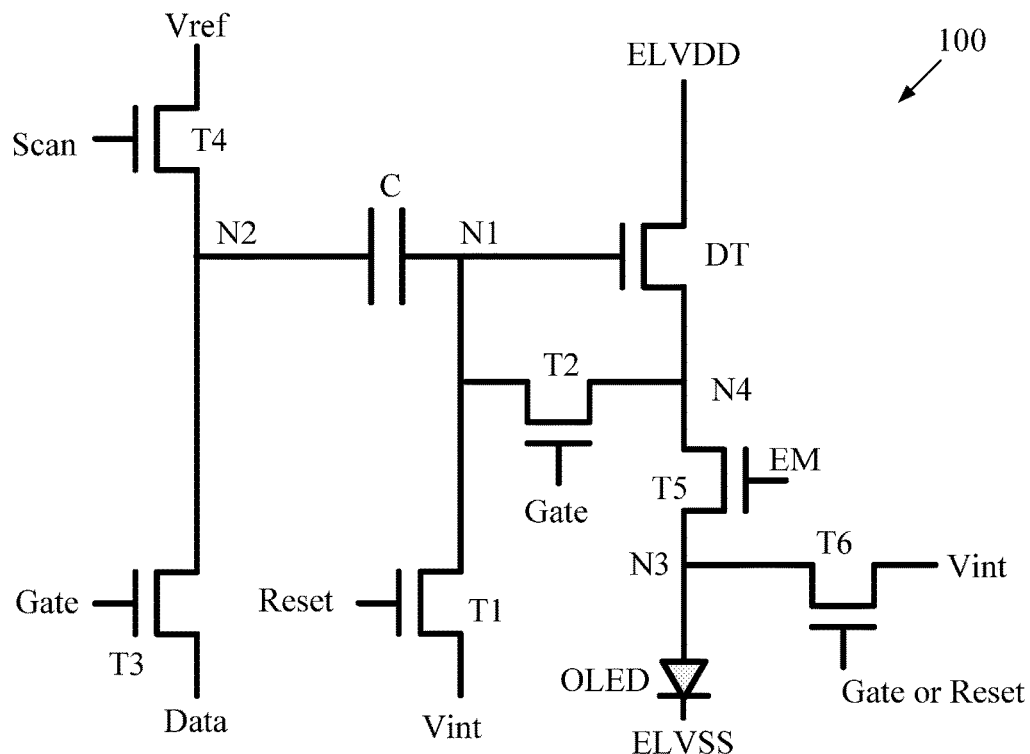
FIG. 3 is a schematic diagram 3 of a pixel circuit provided by the embodiment of the present disclosure.

For instance, as shown in FIG. 3, in the pixel circuit 100 provided by the embodiment of the present disclosure, the reset circuit 120 includes a first transistor T1; the threshold compensation circuit 130 includes a second transistor T2; the first data write circuit 140 includes a third transistor T3; the reference voltage write circuit 150 includes a fourth transistor T4; the emission control circuit 110 includes a fifth transistor T5; and the initializing circuit 160 includes a sixth transistor T6.

For instance, as shown in FIG. 3, in the pixel circuit 100 provided by the embodiment of the present disclosure, the gate electrode of the driving transistor DT is electrically connected with the first node N1; a first electrode of the driving transistor DT is electrically connected with a first power line to receive the first supply voltage ELVDD; and a second electrode of the driving transistor DT is electrically connected with a fourth node N4. The first electrode of the organic light-emitting diode OLED is electrically connected with the third node N3, and the second electrode of the organic light-emitting diode OLED is electrically connected with the second power line to receive the second supply voltage ELVSS. The first end of the storage capacitor C is electrically connected with the first node N1, and the second end of the storage capacitor C is electrically connected with the second node N2. A gate electrode of the first transistor T1 is electrically connected with a reset control signal line to receive the reset control signal Reset; a first electrode of the first transistor T1 is electrically connected with a reset voltage line to receive the reset voltage Vint; and a second electrode of the first transistor T1 is electrically connected with the first node N1. A gate electrode of the second transistor T2 is electrically connected with a first scanning signal line to receive the first scanning signal Gate; a first electrode of the second transistor T2 is electrically connected with the first node N1; and a second electrode of the second transistor T2 is electrically connected with the fourth node N4. A gate electrode of the third transistor T3 is electrically connected with the first scanning signal line to receive the first scanning signal Gate; a first electrode of the third transistor T3 is electrically connected with a data signal line to receive the data signal Data; and a second electrode of the third transistor T3 is electrically connected with the second node N2. A gate electrode of the fourth transistor T4 is electrically connected with a second scanning signal line to receive the second scanning signal Scan; a first electrode of the fourth transistor T4 is electrically connected with a reference voltage line to receive reference voltage Vref; and a second electrode of the fourth transistor T4 is electrically connected with the second node N2. A gate electrode of the fifth transistor T5 is electrically connected with an emission control signal line to receive the emission control signal EM; a first electrode of the fifth transistor T5 is electrically connected with the third node N3; and a second electrode of the fifth transistor T5 is electrically connected with the fourth node N4. A gate electrode of the sixth transistor T6 is electrically connected with the first scanning signal line or the reset control signal line to receive the first scanning signal Gate or the reset control signal Reset; a first electrode of the sixth transistor T6 is electrically connected with the reset voltage line to receive the reset voltage Vint; and a second electrode of the sixth transistor T6 is electrically connected with the third node N3.

It should be noted that the connection of the first electrode of the sixth transistor T6 includes but not limited to the case as shown in FIG. 3 in which it is electrically connected with the reset voltage line to receive the reset voltage Vint, and the first electrode of the sixth transistor T6 may also be electrically connected with an initializing voltage line to receive the initializing voltage Vre.

For instance, in the pixel circuit 100 provided by the embodiment of the present disclosure, the driving transistor DT, the first transistor T1, the second transistor T2, the third transistor T3, the fourth transistor T4, the fifth transistor T5 and the sixth transistor T6 are all P-type transistors.

For instance, in the pixel circuit 100 provided by the embodiment of the present disclosure, the driving transistor DT, the first transistor T1, the second transistor T2, the third transistor T3, the fourth transistor T4, the fifth transistor T5 and the sixth transistor T6 are all TFTs, e.g., P-type thin film transistors (TFTs).

It should be noted that all the transistors adopted in the embodiment of the present disclosure may be TFTs, field-effect transistors (FETs) or other switching elements having same characteristics. A source electrode and a drain electrode of the transistor adopted herein may be symmetrical in structure, so the source electrode and the drain electrode of the transistor may have no difference in structure. In the embodiment of the present disclosure, in order to distinguish two electrodes except the gate electrode of the transistor, one electrode is directly described as the first electrode and the other electrode is directly described as the second electrode, so the first electrode and the second electrode of all or partial transistors in the embodiment of the present disclosure may be exchanged as required. For instance, the first electrode of the transistor in the embodiment of the present disclosure may be the source electrode and the second electrode may be the drain electrode; or the first electrode of the transistor is the drain electrode and the second electrode is the source electrode. In addition, the transistors may be divided into N-type transistors and P-type transistors according to the characteristics of the transistors. Description is given with respect to the embodiments of the present disclosure by taking the case that the driving transistor DT, the first transistor T1, the second transistor T2, the third transistor T3, the fourth transistor T4, the fifth transistor T5 and the sixth transistor T6 are all P-type transistors as an example. Examples that the embodiments of the present disclosure adopt N-type transistors or a combination of N-type transistors and P-type transistors may be easily conceived by those skilled in the art without creative efforts on the basis of the description and instruction of the embodiments in the present disclosure, so the examples shall also fall within the scope of protection of the present disclosure.

Figure 4:
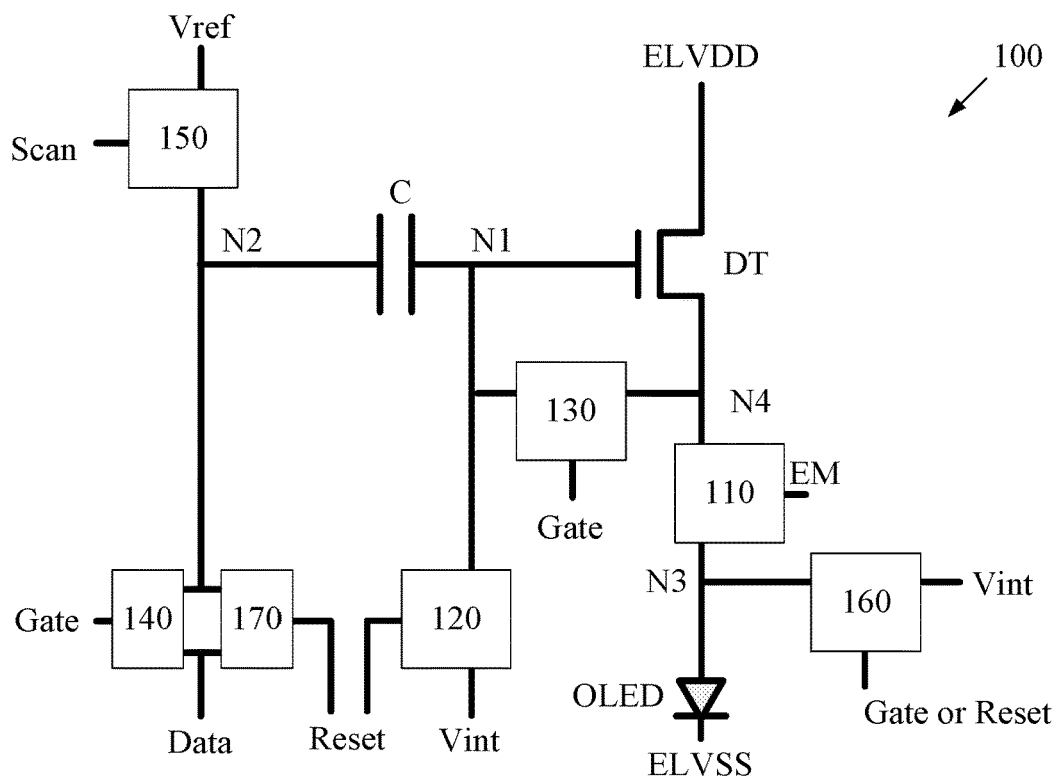
FIG. 4 is a schematic diagram 4 of a pixel circuit provided by the embodiment of the present disclosure.

For instance, as shown in FIG. 4, the pixel circuit 100 provided by the embodiment of the present disclosure further comprises a second data write circuit 170. The second data write circuit 170 is configured to receive the reset control signal Reset and the data signal Data and write the data signal Data into the second node N2 according to the reset control signal Reset.

Figure 5:
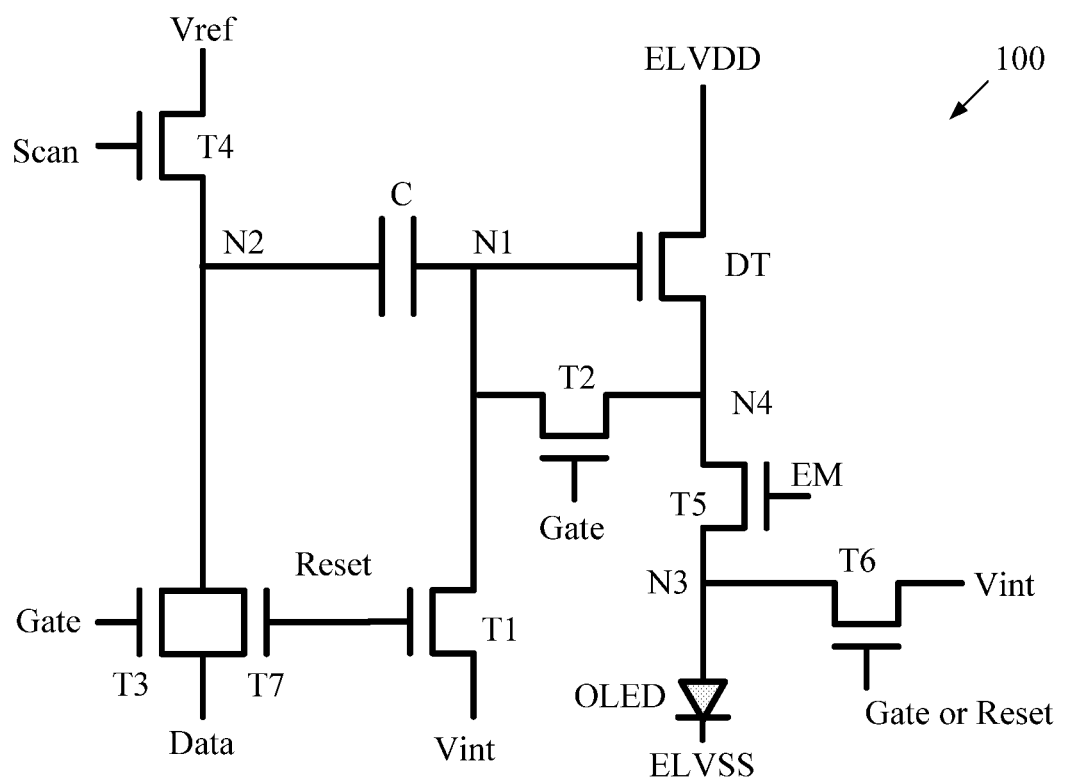
FIG. 5 is a schematic diagram 5 of a pixel circuit provided by the embodiment of the present disclosure.

For instance, as shown in FIG. 5, in the pixel circuit 100 provided by the embodiment of the present disclosure, the reset circuit 120 includes a first transistor T1; the threshold compensation circuit 130 includes a second transistor T2; the first data write circuit 140 includes a third transistor T3; the reference voltage write circuit 150 includes a fourth transistor T4; the emission control circuit 110 includes a fifth transistor T5; the initializing circuit 160 includes a sixth transistor T6; and the second data write circuit 170 includes a seventh transistor T7.

For instance, as shown in FIG. 5, in the pixel circuit 100 provided by the embodiment of the present disclosure, a gate electrode of the driving transistor DT is electrically connected with a first node N1; a first electrode of the driving transistor DT is electrically connected with a first power line to receive a first supply voltage ELVDD; and a second electrode of the driving transistor DT is electrically connected with a fourth node N4. A first electrode of the organic light-emitting diode OLED is electrically connected with a third node N3, and a second electrode of the organic light-emitting diode OLED is electrically connected with a second power line to receive a second supply voltage ELVSS. A first end of the storage capacitor C is electrically connected with the first node N1, and a second end of the storage capacitor C is electrically connected with a second node N2. A gate electrode of the first transistor T1 is electrically connected with a reset control signal line to receive a reset control signal Reset; a first electrode of the first transistor T1 is electrically connected with a reset voltage line to receive reset voltage Vint; and a second electrode of the first transistor T1 is electrically connected with the first node N1. A gate electrode of the second transistor T2 is electrically connected with a first scanning signal line to receive a first scanning signal Gate; a first electrode of the second transistor T2 is electrically connected with the first node N1; and a second electrode of the second transistor T2 is electrically connected with the fourth node N4. A gate electrode of the third transistor T3 is electrically connected with the first scanning signal line to receive the first scanning signal Gate; a first electrode of the third transistor T3 is electrically connected with a data signal line to receive a data signal Data; and a second electrode of the third transistor T3 is electrically connected with the second node N2. A gate electrode of the fourth transistor T4 is electrically connected with a second scanning signal line to receive a second scanning signal Scan; a first electrode of the fourth transistor T4 is electrically connected with a reference voltage line to receive reference voltage Vref; and a second electrode of the fourth transistor T4 is electrically connected with the second node N2. A gate electrode of the fifth transistor T5 is electrically connected with an emission control signal line to receive an emission control signal EM; a first electrode of the fifth transistor T5 is electrically connected with the third node N3; and a second electrode of the fifth transistor T5 is electrically connected with the fourth node N4. A gate electrode of the sixth transistor T6 is electrically connected with the first scanning signal line or the reset control signal line to receive the first scanning signal Gate or the reset control signal Reset; a first electrode of the sixth transistor T6 is electrically connected with the reset voltage line to receive the reset voltage Vint; and a second electrode of the sixth transistor T6 is electrically connected with the third node N3. A gate electrode of the seventh transistor T7 is electrically connected with the reset control signal line to receive the reset control signal Reset; a first electrode of the seventh transistor T7 is electrically connected with the data signal line to receive the data signal Data; and a second electrode of the seventh transistor T7 is electrically connected with the second node N2.

It should be noted that the connection of the first electrode of the sixth transistor T6 includes but not limited to the case as shown in FIG. 5 in which it is electrically connected with the reset voltage line to receive the reset voltage Vint, and the first electrode of the sixth transistor T6 may also be electrically connected with an initializing voltage line to receive the initializing voltage Vre.

For instance, in the pixel circuit 100 provided by the embodiment of the present disclosure, the driving transistor DT, the first transistor T1, the second transistor T2, the third transistor T3, the fourth transistor T4, the fifth transistor T5, the sixth transistor T6 and the seventh transistor T7 are all P-type transistors.

For instance, in the pixel circuit 100 provided by the embodiment of the present disclosure, the driving transistor DT, the first transistor T1, the second transistor T2, the third transistor T3, the fourth transistor T4, the fifth transistor T5, the sixth transistor T6 and the seventh transistor T7 are all TFTs, e.g., P-type thin film transistors (TFTs).

Figure 6:
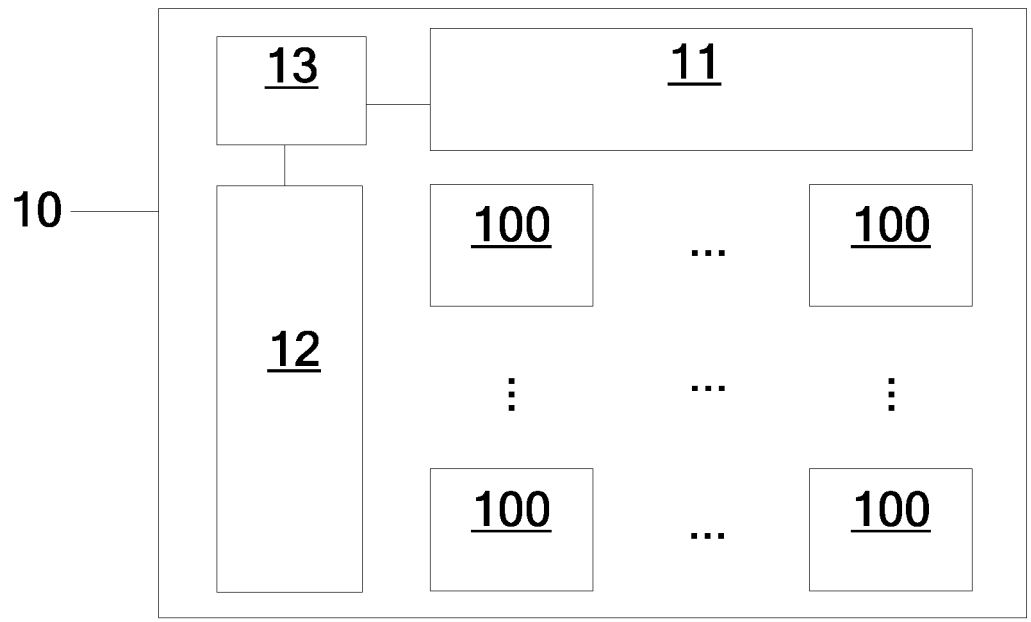
FIG. 6 is a schematic diagram of a display panel provided by the embodiment of the present disclosure.

An embodiment of the present disclosure further provides a display panel 10. As illustrated in FIG. 6, the display panel 10 comprises the pixel circuits 100 provided by any embodiment of the present disclosure.

For instance, the display panel 10 comprises a plurality of pixel circuits 100 arranged in a matrix; each pixel circuit 100 is configured to drive at least one sub-pixel to emit light; and the light emitted by the at least one sub-pixel may be red light, green light, blue light, white light, etc.

For instance, as shown in FIG. 6, the display panel 10 provided by the embodiment of the present disclosure further comprises: a data driver 11, a scan driver 12, and a controller 13. The data driver 11 is configured to provide the data signal Data for the pixel circuit 100 according to an instruction of the controller 13. The scan driver 12 is configured to provide the emission control signal EM, the first scanning signal Gate, the second scanning signal Scan, the reset control signal Reset and the like for the pixel circuit 100 according to the instruction of the controller 13.

For instance, the data driver 11, the scan driver 12 and the controller 13 may be respectively implemented by an application-specific integrated circuit (ASIC) chip and may also be implemented by a circuit or software, hardware (circuit), firmware or any combination thereof. For instance, the scan driver 12 may be implemented by a gate on array (GOA) circuit.

Moreover, for instance, the data driver 11, the scan driver 12 and the controller 13 may be realized by a processor and a memory. In the embodiment of the present disclosure, the processor may process data signals and may include a variety of computational structures, e.g., a complex instruction set computer (CISC) structure, a reduced instruction set computing (RISC) structure or a structure that incorporates a plurality of instruction set combinations. In some embodiments, the processor may also be a microprocessor, e.g., an X86 processor or an ARM processor, and may also be a digital signal processor (DSP), etc. The processor may control other components to execute desired functions. In the embodiment of the present disclosure, the memory may store instructions and/or data executed by the processor. For instance, the memory may include one or more computer program products. The computer program products may include various kinds of computer readable storage media, e.g., volatile memory and/or nonvolatile memory. The volatile memory, for instance, include a random access memory (RAM) and/or a cache memory. The nonvolatile memory, for instance, may include a read-only memory (ROM), a hard disk, a flash memory, etc. One or more computer program instructions may be stored in the computer readable storage medium. The processor may execute the program instructions to realize the desired functions (implemented by the processor) in the embodiment of the present disclosure. Various applications and various data, e.g., data used and/or produced by the applications, may also be stored in the computer readable storage media.

For instance, the display panel 10 further comprises data signal lines, emission control signal lines, first scanning signal lines, second scanning signal lines and reset control signal lines (not shown in FIG. 6). The data driver 11 provides the data signal Data for the pixel circuits 100 through the data signal lines. The scan driver 12 respectively provides the emission control signal EM, the first scanning signal Gate, the second scanning signal Scan and the reset control signal Reset to each of the pixel circuits 100 through the emission control signal line, the first scanning signal line, the second scanning signal line and the reset control signal line.

For instance, the display panel 10 further comprises a power supply (a voltage source or a current source, not shown in the figure), first power lines, second power lines, reference voltage lines, and reset voltage lines (not shown in FIG. 6). The power supply is configured to respectively provide the first supply voltage ELVDD, the second supply voltage ELVSS, the reference voltage Vref, and the reset voltage Vint for the pixel circuits 100 through the first power lines, the second power lines, the reference voltage lines, and the reset voltage lines.

Figure 7:
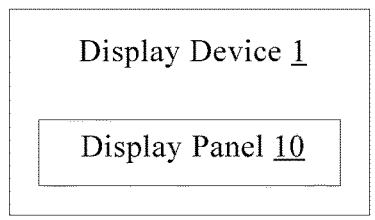
FIG. 7 is a schematic diagram of a display device provided by the embodiment of the present disclosure.

An embodiment of the present disclosure further provides a display device. As illustrated in FIG. 7, the display device 1 comprises the display panel 10 provided by any embodiment of the present disclosure.

For instance, the display device provided by an embodiment of the present disclosure may be any product or component with display function such as a mobile phone, a tablet PC, a TV, a display, a notebook computer, a digital picture frame and a navigator.

Figure 8:
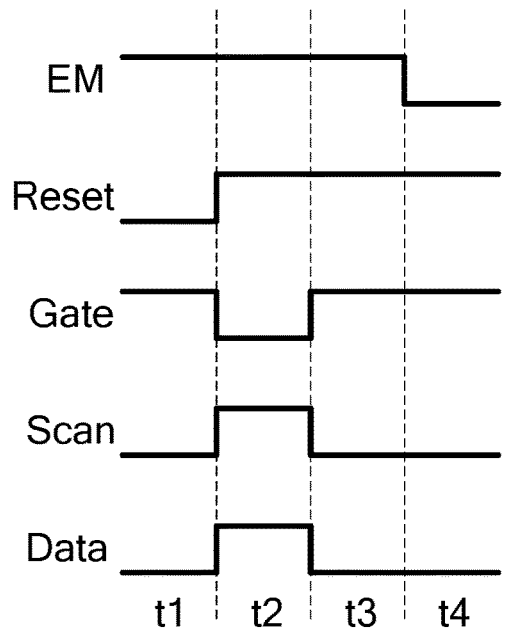
FIGS. 8 and 9 are illustrative drive timing diagrams of the pixel circuit as shown in FIG. 3 provided by the embodiment of the present disclosure.

An embodiment of the present disclosure further provides a driving method of the pixel circuit 100 as shown in FIG. 3. For instance, as shown in FIG. 8, the driving method comprises a reset period t1, a data write and threshold compensation period t2, a voltage drop compensation period t3, and an emission period t4 within the display period of one frame.

In the reset period t1, the emission control signal EM is set to be a turn-off voltage; the reset control signal Reset is set to be a turn-on voltage; the first scanning signal Gate is set to be a turn-off voltage; the second scanning signal Scan is set to be a turn-on voltage; and the data signal Data is set to be an ineffective data signal.

In the data write and threshold compensation period t2, the emission control signal EM is set to be a turn-off voltage; the reset control signal Reset is set to be a turn-off voltage; the first scanning signal Gate is set to be a turn-on voltage; the second scanning signal Scan is set to be a turn-off voltage; and the data signal Data is set to be an effective data signal.

In the voltage drop compensation period t3, the emission control signal EM is set to be a turn-off voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal.

In the emission period t4, the emission control signal EM is set to be a turn-on voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal.

For instance, the turn-on voltage in the embodiments of the present disclosure refers to the voltage capable of switching on the connection between the first electrode and the second electrode of a corresponding transistor, and the turn-off voltage refers to the voltage capable of switching off the first electrode and the second electrode of the corresponding transistor. When the transistors are P-type transistors, the turn-on voltage is a low voltage (e.g., 0V) and the turn-off voltage is a high voltage (e.g., 5V); and when the transistors are N-type transistors, the turn-on voltage is a high voltage (e.g., 5V) and the turn-off voltage is a low voltage (e.g., 0V). Description is given to the drive waveform as shown in FIGS. 8 to 11 by taking the P-type transistors for example, namely the turn-on voltage is a low voltage (e.g., 0V) and the turn-off voltage is a high voltage (e.g., 5V). The ineffective data signal is, for instance, a low voltage signal (e.g., 0V), and the effective data signal is, for instance, a signal including luminescent data information, and is described in FIGS. 8 to 11 by taking a high voltage signal as an example.

For instance, as shown in FIGS. 3 and 8, in the reset period t1, the emission control signal EM is a turn-off voltage; the reset control signal Reset is a turn-on voltage; the first scanning signal Gate is a turn-off voltage; the second scanning signal Scan is a turn-on voltage; and the data signal Data is an ineffective data signal. At this point, the first transistor T1 and the fourth transistor T4 are in the on-state, and the second transistor T2, the third transistor T3 and the fifth transistor T5 are in the off-state. The reset voltage Vint is transmitted to the first node N1 by the first transistor T1, and the reference voltage Vref is transmitted to the second node N2 by the fourth transistor T4. That is to say, the reset circuit receives the reset control signal Reset and writes the reset voltage Vint into the first node N1 according to the reset control signal Reset; and the reference voltage write circuit receives the second scanning signal Scan and writes the reference voltage Vref into the second node N2 according to the second scanning signal Scan.

In the data write and threshold compensation period t2, the emission control signal EM is a turn-off voltage; the reset control signal Reset is a turn-off voltage; the first scanning signal Gate is a turn-on voltage; the second scanning signal Scan is a turn-off voltage; and the data signal Data is an effective data signal. At this point, the second transistor T2 and the third transistor T3 are in the on-state, and the first transistor T1, the fourth transistor T4 and the fifth transistor 15 are in the off-state. At this point, the voltage Vdata of the effective data signal is transmitted to the second node N2 by the third transistor T3, and the voltage of the second node N2 is converted to Vdata from Vref in the reset period t1, namely the first data write circuit receives the first scanning signal Gate and the data signal Data and writes the data signal Data into the second node N2 according to the first scanning signal Gate. The second transistor T2 is switched on and connected with the driving transistor DI to faint a diode structure, and the voltage of the first node N1 is ELVDD+Vth, in which ELVDD is the first supply voltage and Vth is the threshold voltage of the driving transistor, namely the threshold compensation circuit receives the first scanning signal Gate and performs threshold voltage compensation against the voltage of the first node N1 according to the first scanning signal Gate. In this period, the voltage at both ends of the storage capacitor C is ELVDD+Vth−Vdata.

In the voltage drop compensation period t3, the emission control signal EM is a turn-off voltage; the reset control signal Reset is a turn-off voltage; the first scanning signal Gate is a turn-off voltage; the second scanning signal Scan is a turn-on voltage; and the data signal Data is an ineffective data signal. The fourth transistor T4 is in the on-state, and the first transistor T1, the second transistor T2, the third transistor T3 and the fifth transistor T5 are in the off-state. At this point, the reference voltage Vref is transmitted to the second node N2 by the fourth transistor T4 again. Due to the bootstrap function of the storage capacitor C (namely the voltage at both ends of the storage capacitor will not have sudden change), the voltage of the first node N1 is converted into ELVDD+Vth−Vdata+Vref.

In the emission period t4, the emission control signal EM is a turn-on voltage; the reset control signal Reset is a turn-off voltage; the first scanning signal Gate is a turn-off voltage; the second scanning signal Scan is a turn-on voltage; and the data signal Data is an ineffective data signal. The fourth transistor T4 and the fifth transistor T5 are in the on-state, and the first transistor T1, the second transistor T2 and the third transistor T3 are in the off-state. The voltage of the first node N1 is kept to be ELVDD+Vth−Vdata+Vref; the luminous current $I_{oled}$ flows into the organic light-emitting diode OLED through the driving transistor DT and the fifth transistor T5; and the organic light-emitting diode OLED emits light. That is to say, the emission control circuit receives the emission control signal EM and controls the organic light-emitting diode OLED to emit light according to the emission control signal EM. The luminous current $I_{oled}$ satisfies the following saturation current formula:

$$K(Vgs-Vth)^2 = K(\text{ELVDD}+Vth-V\text{data}+V\text{ref}-\text{ELVDD}-Vth)^2 = K(V\text{ref}-V\text{data})^2$$

wherein $$K = 0.5\mu_n Cox \frac{W}{L};$$

$\mu_n$ refers to the channel mobility of the driving transistor; Cox refers to the channel capacitance per unit area of the driving transistor; W and L respectively refer to the channel width and the channel length of the driving transistor; and Vgs refers to the gate source voltage of the driving transistor (the difference between the gate voltage and the source voltage of the driving transistor).

As can be seen from the above formula, the current flowing across the OLED is irrelevant to the threshold voltage of the driving transistor DT and is also irrelevant to the voltage ELVDD any more. Therefore, the pixel circuit well compensates the threshold voltage of the driving transistor DT and the IR drop on the ELVDD wiring.

For instance, when the gate electrode of the sixth transistor T6 is electrically connected with the first scanning signal line to receive the first scanning signal Gate, in the data write and threshold compensation period t2, the sixth transistor T6 is in the on-state, and the potential of the third node N3 is at the initializing voltage Vre (for instance, the initializing voltage Vre is equal to the reset voltage Vint). For instance, the difference between the initializing voltage Vre and the second supply voltage ELVSS is less than the cut-in voltage of the organic light-emitting diode OLED. Moreover, for instance, the initializing voltage Vre is less than or equal to the second supply voltage ELVSS. Thus, the abnormal light emission of the OLED can be avoided, and hence the display quality can be improved. In the emission period t4, the sixth transistor T6 is in the off-state. In the process of displaying a black image, the voltage of the third node N3 may be affected by flowing out of the leakage current of the sixth transistor T6. Therefore, the low brightness in the case of black image is guaranteed, and the display effect is improved.

For instance, when the gate electrode of the sixth transistor T6 is electrically connected with the reset control signal line to receive the reset control signal Reset, in the reset period t1, the sixth transistor T6 is in the on-state, and the potential of the third node N3 is at the initializing voltage Vre (for instance, the initializing voltage Vre is equal to the reset voltage Vint). For instance, the difference between the initializing voltage Vre and the second supply voltage ELVSS is less than the cut-in voltage of the organic light-emitting diode OLED. Moreover, for instance, the initializing voltage Vre is less than or equal to the second supply voltage ELVSS. Thus, the abnormal light emission of the OLED can be avoided, and hence the display quality can be improved. In the emission period t4, the sixth transistor T6 is in the off-state. In the case of displaying a black image, the voltage of the third node N3 may be affected by flowing out of the leakage current of the sixth transistor T6. Therefore, the low brightness in the case of black image is guaranteed, and the display effect is improved.

For instance, as described above, the initializing circuit receives the first scanning signal Gate or the reset control signal Reset and writes the initializing voltage Vre into the third node N3 according to the first scanning signal Gate or the reset control signal Reset. The initializing voltage Vre is, for instance, equal to the reset voltage Vint.

For instance, in the driving method provided by the embodiment of the present disclosure, the ratio of the duration of the emission period t4 to the display period of one frame F is adjustable. Thus, the luminous brightness may be controlled by adjustment of the ratio of the duration of the emission period t4 to the display period of one frame F.

For instance, the ratio of the duration of the emission period t4 to the display period of one frame F is adjusted by control of the scan driver 12 in the display panel.

Figure 9:
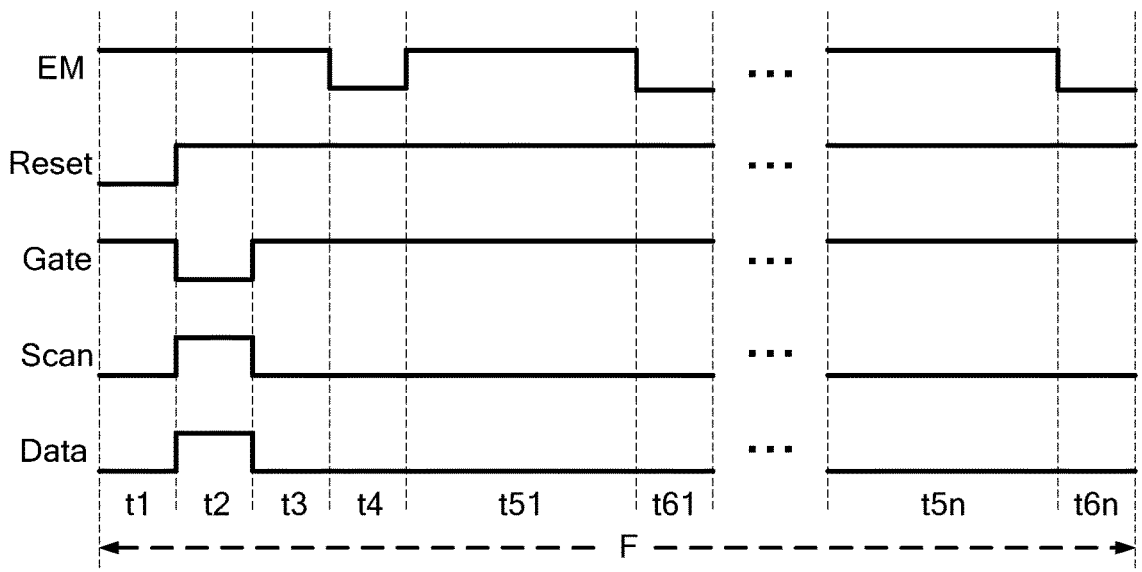

For instance, as shown in FIG. 9, the driving method provided by the embodiment of the present disclosure further comprises an emission continuation period within the display period of one frame F. The emission continuation period includes at least one shutdown sub-period and at least one emission sub-period. For instance, the emission continuation period includes n shutdown sub-periods (t51 . . . t5n) and n emission sub-periods (t61 . . . t6n). In the shutdown sub-period, the emission control signal EM is set to be a turn-off voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal. In the emission sub-period, the emission control signal EM is set to be a turn-on voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal. The setting allows the OLED to switch between luminous state and non-luminous state for multiple times within the display period of one frame, increases the luminous frequency of the OLED, and reduces or avoids the flicker phenomenon caused by visual retention.

For instance, the flicker phenomenon can be well improved when three shutdown sub-periods and three emission sub-periods are included within the display period of one frame, namely n=3.

For instance, in the driving method provided by the embodiment of the present disclosure, the ratio of the sum of the duration of the emission period t4 and the total duration of all the emission sub-periods to the display period of one frame F is adjustable.

For instance, in the driving method provided by the embodiment of the present disclosure, the duration of each shutdown sub-period is equal to the sum of the duration of the reset period t1, the duration of the data write and threshold compensation period t2, and the duration of the voltage drop compensation period t3; and the duration of each emission sub-period is equal to the duration of the emission period t4. This setting can ensure the same luminous duration of the OLED each time and equal interval between emission periods, simplify timing control, and ensure the stability of circuits.

An embodiment of the present disclosure further provides a driving method of the pixel circuit 100 as shown in FIG. 5, which comprises a reset period t1, a data write and threshold compensation period t2, a voltage drop compensation period t3 and an emission period t4 within the display period of one frame.

In the reset period t1, the emission control signal EM is set to be a turn-off voltage; the reset control signal Reset is set to be a turn-on voltage; the first scanning signal Gate is set to be a turn-off voltage; the second scanning signal Scan is set to be a turn-off voltage; and the data signal Data is set to be an effective data signal.

In the data write and threshold compensation period t2, the emission control signal EM is set to be a turn-off voltage; the reset control signal Reset is set to be a turn-off voltage; the first scanning signal Gate is set to be a turn-on voltage; the second scanning signal Scan is set to be a turn-off voltage; and the data signal Data is set to be an effective data signal.

In the voltage drop compensation period t3, the emission control signal EM is set to be a turn-off voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal.

In the emission period t4, the emission control signal EM is set to be a turn-on voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal.

Figure 10:
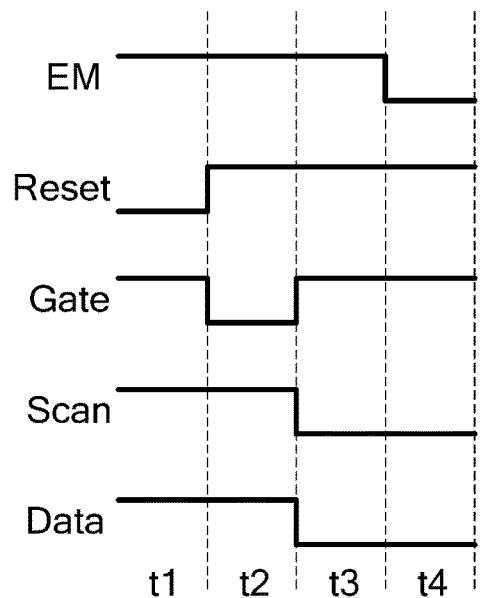
FIGS. 10 and 11 are illustrative drive timing diagrams of the pixel circuit as shown in FIG. 5 provided by the embodiment of the present disclosure.

For instance, as shown in FIGS. 5 and 10, in the reset period t1, the emission control signal EM is a turn-off voltage; the reset control signal Reset is a turn-on voltage; the first scanning signal Gate is a turn-off voltage; the second scanning signal Scan is a turn-off voltage; and the data signal Data is an effective data signal. At this point, the first transistor T1 and the seventh transistor T7 are in the on-state, and the second transistor T2, the third transistor T3, the fourth transistor T4 and the fifth transistor T5 are in the off-state. The reset voltage Vint is transmitted to the first node N1 by the first transistor T1, and the voltage Vdata of the effective data signal is transmitted to the second node N2 by the seventh transistor T7. That is to say, the reset circuit receives the reset control signal Reset and writes the reset voltage Vint into the first node N1 according to the reset control signal Reset; and the second data write circuit receives the reset control signal Reset and the data signal Data and writes the data signal Data into the second node N2 according to the reset control signal Reset.

In the data write and threshold compensation period t2, the emission control signal EM is a turn-off voltage; the reset control signal Reset is a turn-off voltage; the first scanning signal Gate is a turn-on voltage; the second scanning signal Scan is a turn-off voltage; and the data signal Data is an effective data signal. At this point, the second transistor T2 and the third transistor T3 are in the on-state, and the first transistor T1, the fourth transistor T4, the fifth transistor T5 and the seventh transistor T7 are in the off-state. At this point, the voltage Vdata of the effective data signal is transmitted to the second node N2 by the third transistor T3 again. That is to say, the first data write circuit receives the first scanning signal Gate and the data signal Data and writes the data signal Data into the second node N2 according to the first scanning signal Gate. The second transistor T2 is switched on and connected with the driving transistor DT to form a diode structure, and the voltage of the first node N1 is ELVDD+Vth, in which ELVDD is the first supply voltage and Vth is the threshold voltage of the driving transistor. That is to say, the threshold compensation circuit receives the first scanning signal Gate and writes the compensating voltage into the first node N1 according to the first scanning signal Gate, and the compensating voltage is ELVDD+Vth, i.e., the sum of the first supply voltage ELVDD and the threshold voltage Vth of the driving transistor. For instance, in this period, the voltage difference between two ends of the storage capacitor C is ELVDD+Vth−Vdata. In the voltage drop compensation period t4, the emission control signal EM is a turn-off voltage; the reset control signal Reset is a turn-off voltage; the first scanning signal Gate is a turn-off voltage; the second scanning signal Scan is a turn-on voltage; and the data signal Data is an ineffective data signal. The fourth transistor T4 is in the on-state, and the first transistor T1, the second transistor T2, the third transistor T3, the fifth transistor T5 and the seventh transistor T7 are in the off-state. At this point, the reference voltage Vref is transmitted to the second node N2 by the fourth transistor T4 again. Due to the bootstrap function of the storage capacitor C (namely the voltage at both ends of the storage capacitor will not have sudden change), the voltage of the first node N1 is converted into ELVDD+Vth−Vdata+Vref.

In the emission period t4, the emission control signal EM is a turn-on voltage; the reset control signal Reset is a turn-off voltage; the first scanning signal Gate is a turn-off voltage; the second scanning signal Scan is a turn-on voltage; and the data signal Data is an ineffective data signal. The fourth transistor T4, the fifth transistor T5 and the seventh transistor T7 are in the on-state, and the first transistor T1, the second transistor T2 and the third transistor T3 are in the off-state. The voltage of the first node N1 is kept to be ELVDD+Vth−Vdata+Vref; the luminous current Ioled flows into the organic light-emitting diode OLED through the driving transistor DT and the fifth transistor T5; and the organic light-emitting diode OLED emits light. That is to say, the emission control circuit receives the emission control signal EM and controls the organic light-emitting diode OLED to emit light according to the emission control signal EM. The luminous current Ioled satisfies the following saturation current formula:

$$K(Vgs-Vth)^2 = K(\text{ELVDD}+Vth-V\text{data}+V\text{ref}-\text{ELVDD}-Vth)^2 = K(V\text{ref}-V\text{data})^2$$

wherein $$K = 0.5\mu_n Cox \frac{W}{L};$$

$\mu_n$ refers to the channel mobility of the driving transistor; Cox refers to the channel capacitance per unit area of the driving transistor; W and L respectively refer to the channel width and the channel length of the driving transistor; and Vgs refers to the gate source voltage of the driving transistor (the difference between the gate voltage and the source voltage of the driving transistor).

As can be seen from the above formula, the current flowing across the OLED is irrelevant to the threshold voltage of the driving transistor DT and is also irrelevant to the voltage ELVDD any more. Therefore, the pixel circuit well compensates the threshold voltage of the driving transistor DT and the IR drop on the ELVDD wiring.

For instance, compared with the driving method of the drive circuit as shown in FIG. 3, the driving method of the drive circuit as shown in FIG. 5 begins to write the data signal into the second node N2 in the reset period t1, increases the data signal write time, meanwhile, avoids the impact of overlarge voltage change of the second node N2 on the circuit when the reset period t1 is converted into the data write and threshold compensation period t2, and hence is favorable for the stability of the circuit.

For instance, when the gate electrode of the sixth transistor T6 is electrically connected with the first scanning signal line to receive the first scanning signal Gate, in the data write and threshold compensation period t2, the sixth transistor T6 is in the on-state, and the potential of the third node N3 is the initializing voltage Vre (for instance, the initializing voltage Vre is equal to the reset voltage Vint). For instance, the difference between the initializing voltage Vre and the second supply voltage ELVSS is less than the cut-in voltage of the organic light-emitting diode OLED. Moreover, for instance, the initializing voltage Vre is less than or equal to the second supply voltage ELVSS. Thus, the abnormal light emission of the OLED can be avoided, and hence the display quality can be improved. In the emission period t4, the sixth transistor T6 is in the off-state. In the process of displaying a black image, the voltage of the third node N3 may be affected by flowing out of the leakage current of the sixth transistor T6. Therefore, the low brightness in the case of black image is guaranteed, and the display effect is improved.

For instance, when the gate electrode of the sixth transistor T6 is electrically connected with the reset control signal line to receive the reset control signal Reset, in the reset period t1, the sixth transistor T6 is in the on-state, and the potential of the third node N3 is at the initializing voltage Vre (for instance, the initializing voltage Vre is equal to the reset voltage Vint). For instance, the difference between the initializing voltage Vre and the second supply voltage ELVSS is less than the cut-in voltage of the organic light-emitting diode OLED. Moreover, for instance, the initializing voltage Vre is less than or equal to the second supply voltage ELVSS. Thus, the abnormal light emission of the OLED can be avoided, and hence the display quality can be improved. In the emission period t4, the sixth transistor T6 is in the off-state. In the case of displaying a black image, the voltage of the third node N3 may flow out through the leakage current of the sixth transistor T6. Therefore, the low brightness in the case of black image is guaranteed, and the display effect is improved.

For instance, as described above, the initializing circuit receives the first scanning signal Gate or the reset control signal Reset and writes the initializing voltage Vre into the third node N3 according to the first scanning signal Gate or the reset control signal Reset. The initializing voltage Vre is, for instance, equal to the reset voltage Vint.

For instance, in the driving method provided by the embodiment of the present disclosure, the ratio of the duration of the emission period t4 to the display period of one frame F is adjustable. Thus, the luminous brightness may be controlled by adjustment of the ratio of the duration of the emission period t4 to the display period of one frame F.

For instance, the ratio of the duration of the emission period t4 to the display period of one frame F is adjusted by control of the scan driver 12 in the display panel.

Figure 11:
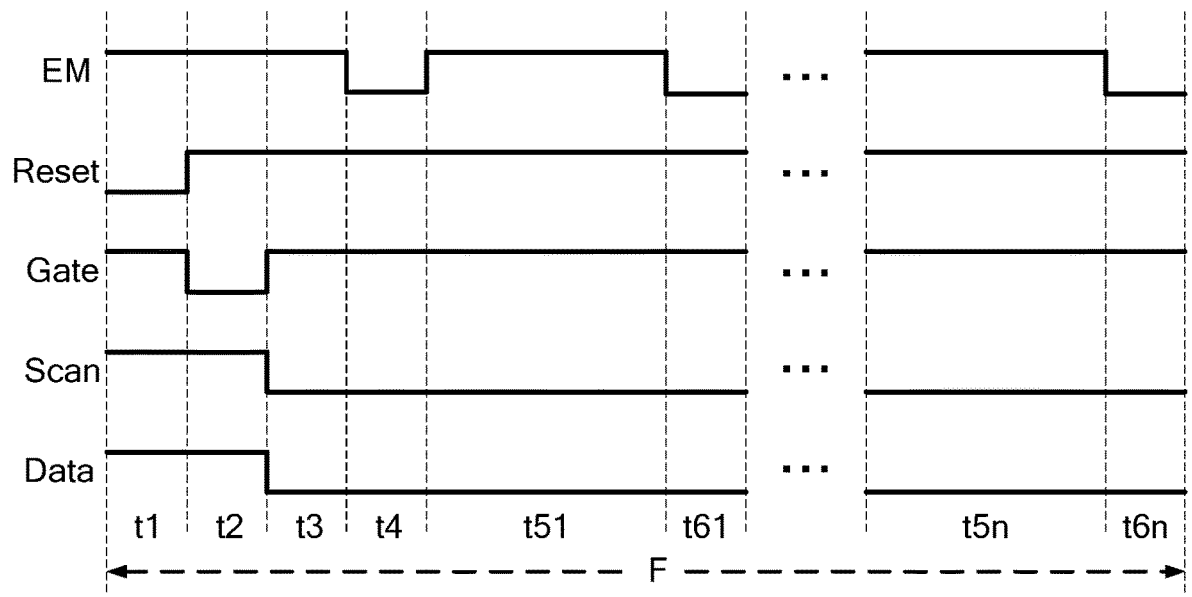

For instance, as shown in FIG. 11, the driving method provided by the embodiment of the present disclosure further comprises an emission continuation period within the display period of one frame F. The emission continuation period includes at least one shutdown sub-period and at least one emission sub-period. For instance, the emission continuation period includes n shutdown sub-periods (t51 ... t5n) and n emission sub-periods (t61 ... t6n). In the shutdown sub-period, the emission control signal EM is set to be a turn-off voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal. In the emission sub-period, the emission control signal EM is set to be a turn-on voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal. The setting allows the OLED to switch between luminous state and non-luminous state for multiple times within the display period of one frame, increases the luminous frequency of the OLED, and reduces or avoids the flicker phenomenon caused by visual retention.

For instance, the flicker phenomenon can be well improved when three shutdown sub-periods and three emission sub-periods are included within the display period of one frame, namely n=3.

For instance, in the driving method provided by the embodiment of the present disclosure, the ratio of the sum of the duration of the emission period t4 and the total duration of all the emission sub-periods to the display period of one frame F is adjustable.

For instance, in the driving method provided by the embodiment of the present disclosure, the duration of each shutdown sub-period is equal to the sum of the duration of the reset period t1, the duration of the data write and threshold compensation period t2, and the duration of the voltage drop compensation period t3; and the duration of each emission sub-period is equal to the duration of the emission period t4. The setting can ensure the same luminous duration of the OLED each time and equal interval between emission periods, simplify timing control, and ensure the stability of circuits.

An embodiment of the present disclosure provides a pixel circuit, a display panel, a display device and a driving method, which can realize the IR drop compensation and the threshold voltage compensation of the display panel, improve the uniformity of drive current, improve the display uniformity of the display panel, meanwhile, reduce the leakage current to ensure high contrast in the black state, and ensure accurate display under a low-grayscale condition by adjustment of the ratio of the emission period in the display period of one frame.

Although detailed description has been given above to the present disclosure with reference to general description and preferred embodiment, it is apparent to those skilled in the art that some modifications or improvements may be made on the basis of the embodiments of the present disclosure. Therefore, the modifications or improvements made without departing from the spirit of the present disclosure shall all fall within the scope of protection of the present disclosure.

The application claims priority to the Chinese patent application No. 201610703367.9, filed Aug. 22, 2016, the entire disclosure of which is incorporated herein by reference as part of the present application.

What is claimed is:

1. A pixel circuit, comprising:
a storage capacitor including a first end connected with a first node and a second end connected with a second node;
an organic light-emitting diode (OLED) including a first electrode connected with a third node;
a driving transistor including a gate electrode connected with the first node, wherein the driving transistor is configured to control the OLED to emit light according to a voltage of the first node;
an emission control circuit configured to receive an emission control signal and control an on/off state of the OLED according to the emission control signal;
a reset circuit configured to receive a reset control signal and write a reset voltage into the first node according to the reset control signal;
a threshold compensation circuit configured to receive a first scanning signal and write a compensating voltage into the first node according to the first scanning signal, wherein the compensating voltage is a sum of a first supply voltage and a threshold voltage of the driving transistor;
a first data write circuit configured to receive the first scanning signal and a data signal and write the data signal into the second node according to the first scanning signal;
a reference voltage write circuit configured to receive a second scanning signal and write a reference voltage into the second node according to the second scanning signal; and
an initializing circuit configured to receive the first scanning signal and write an initializing voltage into the third node according to the first scanning signal,
wherein the initializing circuit is controlled by the first scanning signal, the reset circuit is controlled by the reset control signal, and the first scanning signal is different from the reset control signal;
the reference voltage is different from the first supply voltage, and is different from the initializing voltage;
wherein in a reset period within a display period of one frame, the emission control signal is set to be a turn-off voltage; the reset control signal is set to be a turn-on voltage; the first scanning signal is set to be a turn-off voltage; the second scanning signal is set to be a turn-on voltage; the data signal is set to be an ineffective data signal, the emission control circuit is configured to be turned off under control of the emission control signal to control to turn off a connection between the OLED and the driving transistor, the reset circuit is configured to be turned on under control of the reset control signal to write the reset voltage into the first node, the threshold compensation circuit is configured to be turned off under control of the first scanning signal, the first data write circuit is configured to be turned off under control of the first scanning signal, the reference voltage write circuit is configured to be turned on under control of the second scanning signal to write the reference voltage into the second node, and the initializing circuit is configured to be turned off under control of the first scanning signal;

in a data write and threshold compensation period within the display period of one frame, the emission control signal is set to be a turn-off voltage; the reset control signal is set to be a turn-off voltage; the first scanning signal is set to be a turn-on voltage; the second scanning signal is set to be a turn-off voltage; the data signal is set to be an effective data signal, the emission control circuit is configured to be turned off under control of the emission control signal to control to turn off the connection between the OLED and the driving transistor, the reset circuit is configured to be turned off under control of the reset control signal, the threshold compensation circuit is configured to be turned on under control of the first scanning signal to write the compensation voltage into the first node, the first data write circuit is configured to be turned on under control of the first scanning signal to write the effective data signal into the second node, the reference voltage write circuit is configured to be turned off under control of the second scanning signal, and the initializing circuit is configured to be turned on under control of the first scanning signal to write the initializing voltage into the third node;

in a voltage drop compensation period within the display period of one frame, the emission control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal, the emission control circuit is configured to be turned off under control of the emission control signal to control to turn off the connection between the OLED and the driving transistor, the reset circuit is configured to be turned off under control of the reset control signal, the threshold compensation circuit is configured to be turned off under control of the first scanning signal, the first data write circuit is configured to be turned off under control of the first scanning signal, the reference voltage write circuit is configured to be turned on under control of the second scanning signal to write the reference voltage into the second node, and the initializing circuit is configured to be turned off under control of the first scanning signal; and in an emission period within the display period of one frame, the emission control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal, the emission control circuit is configured to be turned on under control of the emission control signal to control the OLED to emit light, the reset circuit is configured to be turned off under control of the reset control signal, the threshold compensation circuit is configured to be turned off under control of the first scanning signal, the first data write circuit is configured to be turned off under control of the first scanning signal, the reference voltage write circuit is configured to be turned on under control of the second scanning signal to write the reference voltage into the second node, and the initializing circuit is configured to be turned off under control of the first scanning signal.

2. The pixel circuit according to claim 1, wherein the initializing voltage is equal to the reset voltage.

3. The pixel circuit according to claim 1, wherein the OLED further includes a second electrode;
the second electrode of the OLED is electrically connected with a second power line to receive a second supply voltage;
the first electrode of the OLED is an anode; the second electrode of the OLED is a cathode; and
difference between the initializing voltage and the second supply voltage is less than a cut-in voltage of the OLED.

4. The pixel circuit according to claim 3, wherein the initializing voltage is less than the second supply voltage.

5. The pixel circuit according to claim 1, wherein the reset circuit includes a first transistor;
the threshold compensation circuit includes a second transistor;
the first data write circuit includes a third transistor;
the reference voltage write circuit includes a fourth transistor;
the emission control circuit includes a fifth transistor; and
the initializing circuit includes a sixth transistor.

6. The pixel circuit according to claim 5, wherein
a gate electrode of the driving transistor is electrically connected with the first node; a first electrode of the driving transistor is electrically connected with a first power line to receive the first supply voltage; and a second electrode of the driving transistor is electrically connected with a fourth node;
the first electrode of the OLED is electrically connected with the third node, and a second electrode of the OLED is electrically connected with a second power line to receive a second supply voltage;
a gate electrode of the first transistor is electrically connected with a reset control signal line to receive the reset control signal; a first electrode of the first transistor is electrically connected with a reset voltage line to receive the reset voltage; and a second electrode of the first transistor is electrically connected with the first node;
a gate electrode of the second transistor is electrically connected with a first scanning signal line to receive the first scanning signal; a first electrode of the second transistor is electrically connected with the first node; and a second electrode of the second transistor is electrically connected with the fourth node;
a gate electrode of the third transistor is electrically connected with the first scanning signal line to receive the first scanning signal; a first electrode of the third transistor is electrically connected with a data signal line to receive the data signal; and a second electrode of the third transistor is electrically connected with the second node;
a gate electrode of the fourth transistor is electrically connected with a second scanning signal line to receive a second scanning signal; a first electrode of the fourth transistor is electrically connected with a reference voltage line to receive the reference voltage; and a second electrode of the fourth transistor is electrically connected with the second node;
a gate electrode of the fifth transistor is electrically connected with an emission control signal line to receive the emission control signal; a first electrode of the fifth transistor is electrically connected with the third node; and a second electrode of the fifth transistor is electrically connected with the fourth node; and a gate electrode of the sixth transistor is electrically connected with the first scanning signal line to receive the first scanning signal; a first electrode of the sixth transistor is electrically connected with the reset voltage line to receive the reset voltage; and a second electrode of the sixth transistor is electrically connected with the third node.

7. The pixel circuit according to claim 1, further comprising a second data write circuit configured to receive the reset control signal and the data signal and write the data signal into the second node according to the reset control signal.

8. The pixel circuit according to claim 7, wherein the reset circuit includes a first transistor;
the threshold compensation circuit includes a second transistor;
the first data write circuit includes a third transistor;
the reference voltage write circuit includes a fourth transistor;
the emission control circuit includes a fifth transistor;
the initializing circuit includes a sixth transistor; and
the second data write circuit includes a seventh transistor.

9. The pixel circuit according to claim 8, wherein
a gate electrode of the driving transistor is electrically connected with the first node; a first electrode of the driving transistor is electrically connected with a first power line to receive the first supply voltage; and a second electrode of the driving transistor is electrically connected with a fourth node;
the first electrode of the OLED is electrically connected with the third node, and a second electrode of the OLED is electrically connected with a second power line to receive a second supply voltage;
a gate electrode of the first transistor is electrically connected with a reset control signal line to receive the reset control signal; a first electrode of the first transistor is electrically connected with a reset voltage line to receive the reset voltage; and a second electrode of the first transistor is electrically connected with the first node;
a gate electrode of the second transistor is electrically connected with a first scanning signal line to receive the first scanning signal; a first electrode of the second transistor is electrically connected with the first node; and a second electrode of the second transistor is electrically connected with the third node;
a gate electrode of the third transistor is electrically connected with the first scanning signal line to receive the first scanning signal; a first electrode of the third transistor is electrically connected with a data signal line to receive the data signal; and a second electrode of the third transistor is electrically connected with the second node;
a gate electrode of the fourth transistor is electrically connected with a second scanning signal line to receive the second scanning signal; a first electrode of the fourth transistor is electrically connected with a reference voltage line to receive the reference voltage; and a second electrode of the fourth transistor is electrically connected with the second node;
a gate electrode of the fifth transistor is electrically connected with a emission control signal line to receive the emission control signal; a first electrode of the fifth transistor is electrically connected with the third node; and a second electrode of the fifth transistor is electrically connected with the fourth node;
a gate electrode of the sixth transistor is electrically connected with the first scanning signal line or the reset control signal line to receive the first scanning signal or the reset control signal; a first electrode of the sixth transistor is electrically connected with the reset voltage line to receive the reset voltage; and a second electrode of the sixth transistor is electrically connected with the third node; and
a gate electrode of the seventh transistor is electrically connected with the reset control signal line to receive the reset control signal; a first electrode of the seventh transistor is electrically connected with the data signal line to receive the data signal; and a second electrode of the seventh transistor is electrically connected with the second node.

10. A display panel, comprising the pixel circuit according to claim 1.

11. The display panel according to claim 10, further comprising:
a data driver configured to provide the data signal for the pixel circuit; and
a scan driver configured to provide the emission control signal, the first scanning signal, the second scanning signal and the reset control signal for the pixel circuit.

12. A display device, comprising the display panel according to claim 10.

13. A driving method of the pixel circuit according to claim 1, comprising a reset period, a data write and threshold compensation period, a voltage drop compensation period, and an emission period within the display period of one frame, wherein
in the reset period, the emission control signal is set to be a turn-off voltage; the reset control signal is set to be a turn-on voltage; the first scanning signal is set to be a turn-off voltage; the second scanning signal is set to be a turn-on voltage; the data signal is set to be an ineffective data signal;
in the data write and threshold compensation period, the emission control signal is set to be a turn-off voltage; the reset control signal is set to be a turn-off voltage; the first scanning signal is set to be a turn-on voltage; the second scanning signal is set to be a turn-off voltage; the data signal is set to be an effective data signal;
in the voltage drop compensation period, the emission control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal; and
in the emission period, the emission control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal.

14. A driving method of a pixel circuit, wherein the pixel circuit comprises:
a storage capacitor including a first end connected with a first node and a second end connected with a second node;
an organic light-emitting diode (OLED) including a first electrode connected with a third node;
a driving transistor including a gate electrode connected with the first node, wherein the driving transistor is configured to control the OLED to emit light according to a voltage of the first node;

an emission control circuit configured to receive an emission control signal and control an on/off state of the OLED according to the emission control signal;

a reset circuit configured to receive a reset control signal and write a reset voltage into the first node according to the reset control signal;

a threshold compensation circuit configured to receive a first scanning signal and write a compensating voltage into the first node according to the first scanning signal, wherein the compensating voltage is a sum of a first supply voltage and a threshold voltage of the driving transistor;

a first data write circuit configured to receive the first scanning signal and a data signal and write the data signal into the second node according to the first scanning signal;

a reference voltage write circuit configured to receive a second scanning signal and write a reference voltage into the second node according to the second scanning signal;

an initializing circuit configured to receive the first scanning signal or the reset control signal and write an initializing voltage into the third node according to the first scanning signal or the reset control signal; and a second data write circuit configured to receive the reset control signal and the data signal and write the data signal into the second node according to the reset control signal, the driving method comprises a reset period, a data write and threshold compensation period, a voltage drop compensation period and an emission period within a display period of one frame, wherein in the reset period, the emission control signal is set to be a turn-off voltage; the reset control signal is set to be a turn-on voltage; the first scanning signal is set to be a turn-off voltage; the second scanning signal is set to be a turn-off voltage; the data signal is set to be an effective data signal;

in the data write and threshold compensation period, the emission control signal is set to be a turn-off voltage; the reset control signal is set to be a turn-off voltage; the first scanning signal is set to be a turn-on voltage; the second scanning signal is set to be a turn-off voltage; the data signal is set to be an effective data signal;

in the voltage drop compensation period, the emission control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal;

in the emission period, the emission control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal.

15. The driving method according to claim 1, further comprising an emission continuation period within the display period of one frame, wherein the emission continuation period includes at least one shutdown sub-period and at least one emission sub-period;

in the shutdown sub-period, the emission control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal;

in the emission sub-period, the emission control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal.

16. The driving method according to claim 15, wherein a duration of each shutdown sub-period is equal to a sum of a duration of the reset period, a duration of the data write and threshold compensation period, and a duration of the voltage drop compensation period; and a duration of each emission sub-period is equal to a duration of the emission period.

17. The driving method according to claim 15, wherein a ratio of a duration of the emission period in the display period of one frame is adjustable.

18. The driving method according to claim 15, wherein a ratio of a sum of a duration of the emission period and total duration of the emission sub-period or emission sub-periods to the display period of one frame is adjustable.

19. The pixel circuit according to claim 1, wherein a phase of the first scanning signal and a phase of the second scanning signal are opposite to each other.

20. A pixel circuit, comprising:
a storage capacitor including a first end connected with a first node and a second end connected with a second node;

an organic light-emitting diode (OLED) including a first electrode connected with a third node;

a driving transistor including a gate electrode connected with the first node, wherein the driving transistor is configured to control the OLED to emit light according to a voltage of the first node;

an emission control circuit configured to receive an emission control signal and control an on/off state of the OLED according to the emission control signal;

a reset circuit configured to receive a reset control signal and write a reset voltage into the first node according to the reset control signal;

a threshold compensation circuit configured to receive a first scanning signal and write a compensating voltage into the first node according to the first scanning signal, wherein the compensating voltage is a sum of a first supply voltage and a threshold voltage of the driving transistor;

a first data write circuit configured to receive the first scanning signal and a data signal and write the data signal into the second node according to the first scanning signal;

a reference voltage write circuit configured to receive a second scanning signal and write a reference voltage into the second node according to the second scanning signal; and an initializing circuit configured to receive the first scanning signal and write an initializing voltage into the third node according to the first scanning signal, wherein in a reset period within a display period of one frame, the emission control signal is set to be a turn-off voltage; the reset control signal is set to be a turn-on voltage; the first scanning signal is set to be a turn-off voltage; the second scanning signal is set to be a turn-off voltage; the data signal is set to be an effective data signal, the emission control circuit is configured to be turned off under control of the emission control signal to control to turn off a connection between the OLED and the driving transistor, the reset circuit is configured to be turned on under control of the reset control signal to write the reset voltage into the first node, the threshold compensation circuit is configured to be turned off under control of the first scanning signal, the first data write circuit is configured to be turned off under control of the first scanning signal, the reference voltage write circuit is configured to be turned off under control of the second scanning signal, the initializing circuit is configured to be turned off under control of the first scanning signal, and the second data write circuit is configured to be turned on under control of the reset control signal to write the effective data signal into the second node;

in a data write and threshold compensation period within the display period of one frame, the emission control signal is set to be a turn-off voltage; the reset control signal is set to be a turn-off voltage; the first scanning signal is set to be a turn-on voltage; the second scanning signal is set to be a turn-off voltage; the data signal is set to be the effective data signal, the emission control circuit is configured to be turned off under control of the emission control signal to control to turn off the connection between the OLED and the driving transistor, the reset circuit is configured to be turned off under control of the reset control signal, the threshold compensation circuit is configured to be turned on under control of the first scanning signal to write the compensation voltage into the first node, the first data write circuit is configured to be turned on under control of the first scanning signal to write the effective data signal into the second node, the reference voltage write circuit is configured to be turned off under control of the second scanning signal, the initializing circuit is configured to be turned on under control of the first scanning signal to write the initializing voltage into the third node, and the second data write circuit is configured to be turned off under control of the reset control signal;

in a voltage drop compensation period within the display period of one frame, the emission control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal, the emission control circuit is configured to be turned off under control of the emission control signal to control to turn off the connection between the OLED and the driving transistor, the reset circuit is configured to be turned off under control of the reset control signal, the threshold compensation circuit is configured to be turned off under control of the first scanning signal, the first data write circuit is configured to be turned off under control of the first scanning signal, the reference voltage write circuit is configured to be turned on under control of the second scanning signal to write the reference voltage into the second node, the initializing circuit is configured to be turned off under control of the first scanning signal, and the second data write circuit is configured to be turned off under control of the reset control signal; and in an emission period within the display period of one frame, the emission control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal, the emission control circuit is configured to be turned on under control of the emission control signal to control the OLED to emit light, the reset circuit is configured to be turned off under control of the reset control signal, the threshold compensation circuit is configured to be turned off under control of the first scanning signal, the first data write circuit is configured to be turned off under control of the first scanning signal, the reference voltage write circuit is configured to be turned on under control of the second scanning signal to write the reference voltage into the second node, the initializing circuit is configured to be turned off under control of the first scanning signal, and the second data write circuit is configured to be turned off under control of the reset control signal.

* * * * *